United States Patent
Tatsumi

(10) Patent No.: US 6,437,590 B1
(45) Date of Patent: Aug. 20, 2002

(54) INTEGRATED SEMICONDUCTOR DEVICE WITH WAFER-LEVEL BURN-IN CIRCUIT AND FUNCTION DECISION METHOD OF WAFER-LEVEL BURN-IN CIRCUIT

(75) Inventor: Takashi Tatsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 47 days.

(21) Appl. No.: 09/649,078

(22) Filed: Aug. 28, 2000

(30) Foreign Application Priority Data

Mar. 6, 2000 (JP) ......................... 2000-061024

(51) Int. Cl.[7] .................. G01R 31/02; G01R 31/28; H04L 1/24
(52) U.S. Cl. ................ 324/763; 324/760; 714/47; 714/712; 438/17
(58) Field of Search .................. 324/763, 760, 324/765, 522; 714/47, 48, 712; 438/17

(56) References Cited

U.S. PATENT DOCUMENTS 6,184,048 B1 * 2/2001 Ramon ................ 438/14

6,326,800 B1 * 12/2001 Kirihata ................ 324/760

FOREIGN PATENT DOCUMENTS

JP          9-17198          1/1997

* cited by examiner

*Primary Examiner*—N. Le
*Assistant Examiner*—Anjan K. Deb
(74) *Attorney, Agent, or Firm*—Burns, Doane, Swecker & Mathis, LLP

(57) ABSTRACT

An integrated semiconductor device with a wafer-level burn-in circuit includes a test mode register and an access controller. The integrated semiconductor device is set at a voltage force mode by placing the test mode register at a test mode, and is forcedly supplied with prescribed voltages. The wafer-level burn-in is carried out by setting an access controller at a WLBI (wafer-level burn-in) mode with maintaining the test mode. After completing the wafer-level burn-in operation, the WLBI mode is released. Then, an external tester reads test data from a memory core in the test mode, and compares the test data with expected values. The integrated semiconductor device with a wafer-level burn-in circuit can solve a problem of a conventional integrated semiconductor device with a wafer-level burn-in circuit in that it cannot verify the function of the wafer-level burn-in circuit properly.

6 Claims, 8 Drawing Sheets

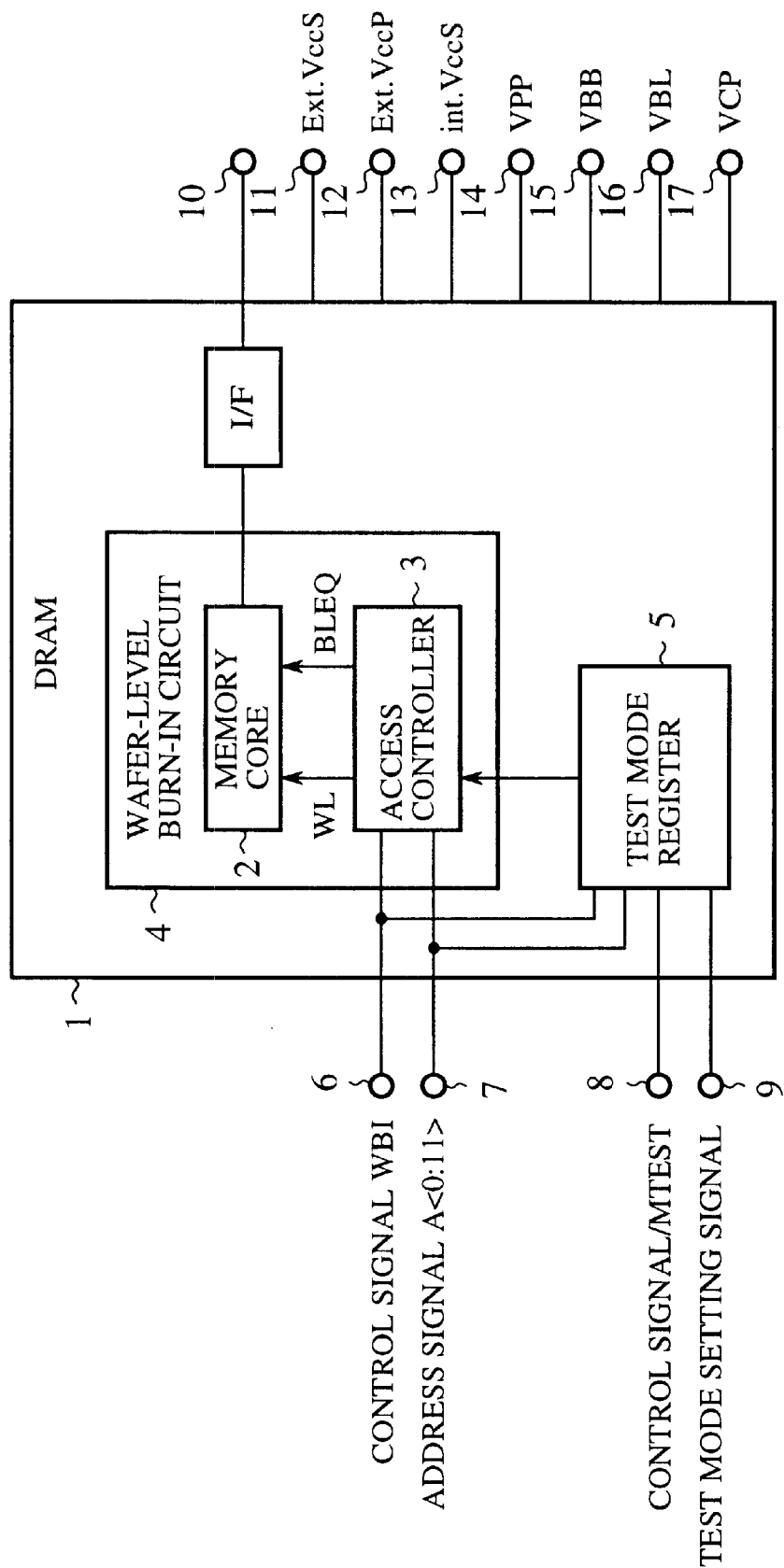

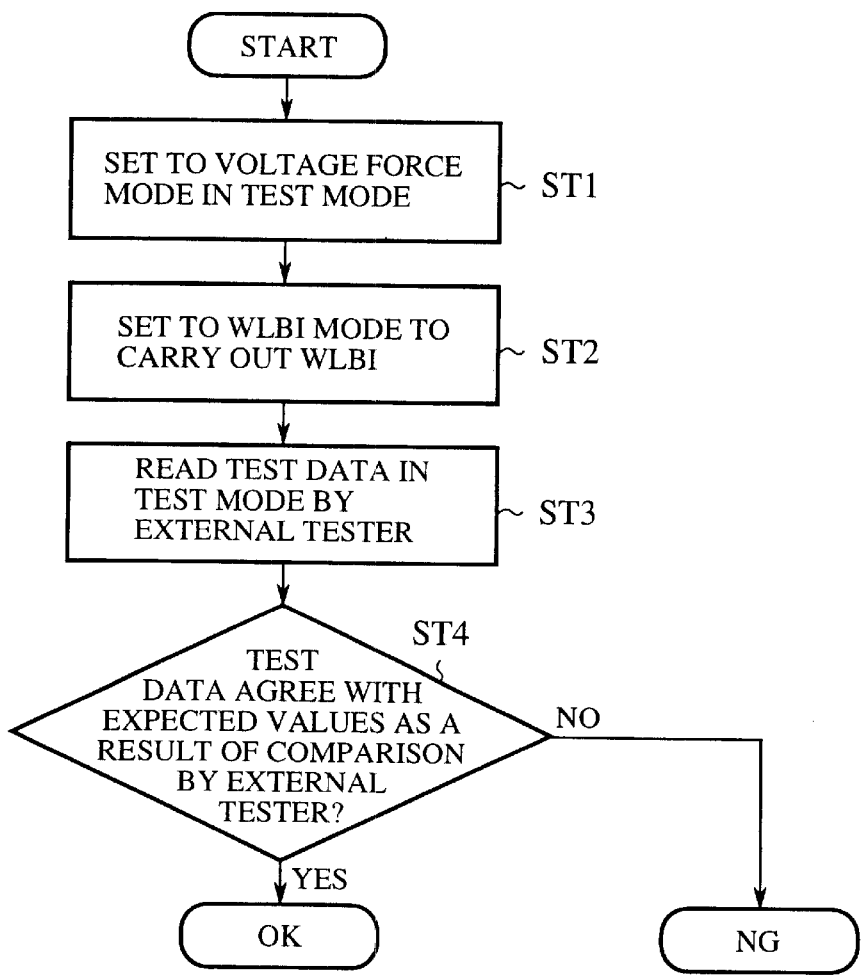

INTEGRATED SEMICONDUCTOR DEVICE WITH WAFER-LEVEL BURN-IN CIRCUIT AND FUNCTION DECISION METHOD OF WAFER-LEVEL BURN-IN CIRCUIT

BACKGROUND OF THE INVENTION

1. Field of the Invention

The present invention relates to an integrated semiconductor device with a wafer-level burn-in circuit and a function decision method of a wafer-level burn-in circuit for checking as to whether a wafer-level burn-in circuit for controlling wafer-level burn-in functions correctly or not.

2. Description of Related Art

Conventionally, wafer-level burn-in has been performed to remove defective integrated semiconductor devices including various types of memories such as DRAM and SRAM and/or various types of logic circuits by checking them by applying various stresses before factory shipment.

For example, Japanese patent application laid-open No. 9-17198/1997 discloses a technique relating to conventional wafer-level burn-in. The wafer-level burn-in checks as to whether an integrated semiconductor device operates properly by driving all the word lines simultaneously, and by comparing by an external tester the data read from memory cells in a memory core or the like with expected values prepared in advance. This will make it possible to remove the defective integrated semiconductor devices before shipment.

The conventional integrated semiconductor devices with such an arrangement undergo operation test that applies to the integrated semiconductor devices not only operation voltages higher or lower than those used in a bias accelerated test in normal burn-in, but also various stresses such as heating or cooling the integrated semiconductor devices. The operation test, however, has a problem in the reliability of the wafer-level burn-in because it cannot verify whether the wafer-level burn-in circuit functions correctly or not in performing and controlling the wafer-level burn-in.

SUMMARY OF THE INVENTION

The present invention is implemented to solve the foregoing problem. It is therefore an object of the present invention to provide an integrated semiconductor device with a wafer-level burn-in circuit and a function decision method of a wafer-level burn-in circuit capable of verifying whether the wafer-level burn-in circuit functions properly or not.

According to a first aspect of the present invention, there is provided an integrated semiconductor device with a wafer-level burn-in circuit comprising: a memory core including a plurality of memory cells; an access controller for controlling wafer-level burn-in operation by controlling input and output of control signals, an address signal and test data used by the wafer-level burn-in operation; and a test mode register for setting operation conditions of the wafer-level burn-in operation, wherein the integrated semiconductor device is set, when the test mode register is set in a test mode, in a DMA (direct memory access) mode that enables the address signal, the test data and prescribed voltages to be directly input from and output to outside, and is forcedly supplied with the prescribed voltages required for the wafer-level burn-in operation, wherein the access controller, being set in a wafer-level burn-in mode, supplies the memory core with the address signal and test data in accordance with a wafer-level burn-in operation condition which is set in the test mode register, and performs the wafer-level burn-in operation, and wherein the integrated semiconductor device reads, when the access controller is released from the wafer-level burn-in mode, the test data in the memory core in the DMA mode, and outputs the test data to the outside.

Here, the integrated semiconductor device with wafer-level burn-in circuit may further comprise an expected value comparator for reading the test data in the memory core after the wafer-level burn-in operation is completed and the access controller is released from the wafer-level burn-in mode, for comparing the test data read from the memory core with preset expected values, and for outputting a compared result, wherein the integrated semiconductor device may output the compared result obtained by the expected value comparator.

The access controller may perform the wafer-level burn-in operation by supplying the memory core with one of the address signal for selecting all word lines in the core memory simultaneously, the address signal for selecting only even number word lines simultaneously, and the address signal for selecting only odd number word lines simultaneously.

According to a second aspect of the present invention, there is provided a function decision method of a wafer-level burn-in circuit comprising the steps of: setting in a test mode a test mode register in which a wafer-level burn-in operation condition is set; setting an integrated semiconductor device with the wafer-level burn-in circuit in a DMA (direct memory access) mode that enables an address signal, test data and prescribed voltages to be directly input from and output to outside; forcedly applying the prescribed voltages required for the wafer-level burn-in operation to the integrated semiconductor device; performing the wafer-level burn-in operation, when an access controller in the wafer-level burn-in circuit is set in a wafer-level burn-in mode and supplies a memory core with the address signal and test data in accordance with the wafer-level burn-in operation condition set in the test mode register; releasing the access controller from the wafer-level burn-in mode after completing the wafer-level burn-in operation; reading the test data in the memory core in the DMA mode; and outputting the test data read from the memory core to the outside to be compared with expected values.

Here, the function decision method of the wafer-level burn-in circuit may further comprise the steps of: reading the test data from the memory core after releasing the access controller; comparing the test data read from the memory core with preset expected values; and outputting a compared result as a function decision result of the wafer-level burn-in circuit.

BRIEF DESCRIPTION OF THE DRAWINGS

FIG. 1 is a block diagram showing a configuration of an embodiment 1 of an integrated semiconductor device with a wafer-level burn-in circuit in accordance with the present invention;

FIG. 2 is a flowchart illustrating the wafer-level burn-in operation of he embodiment 1;

FIG. 3 is a table illustrating set values preset in a test mode register;

DETAILED DESCRIPTION OF THE PREFERRED EMBODIMENTS

Figure 4:
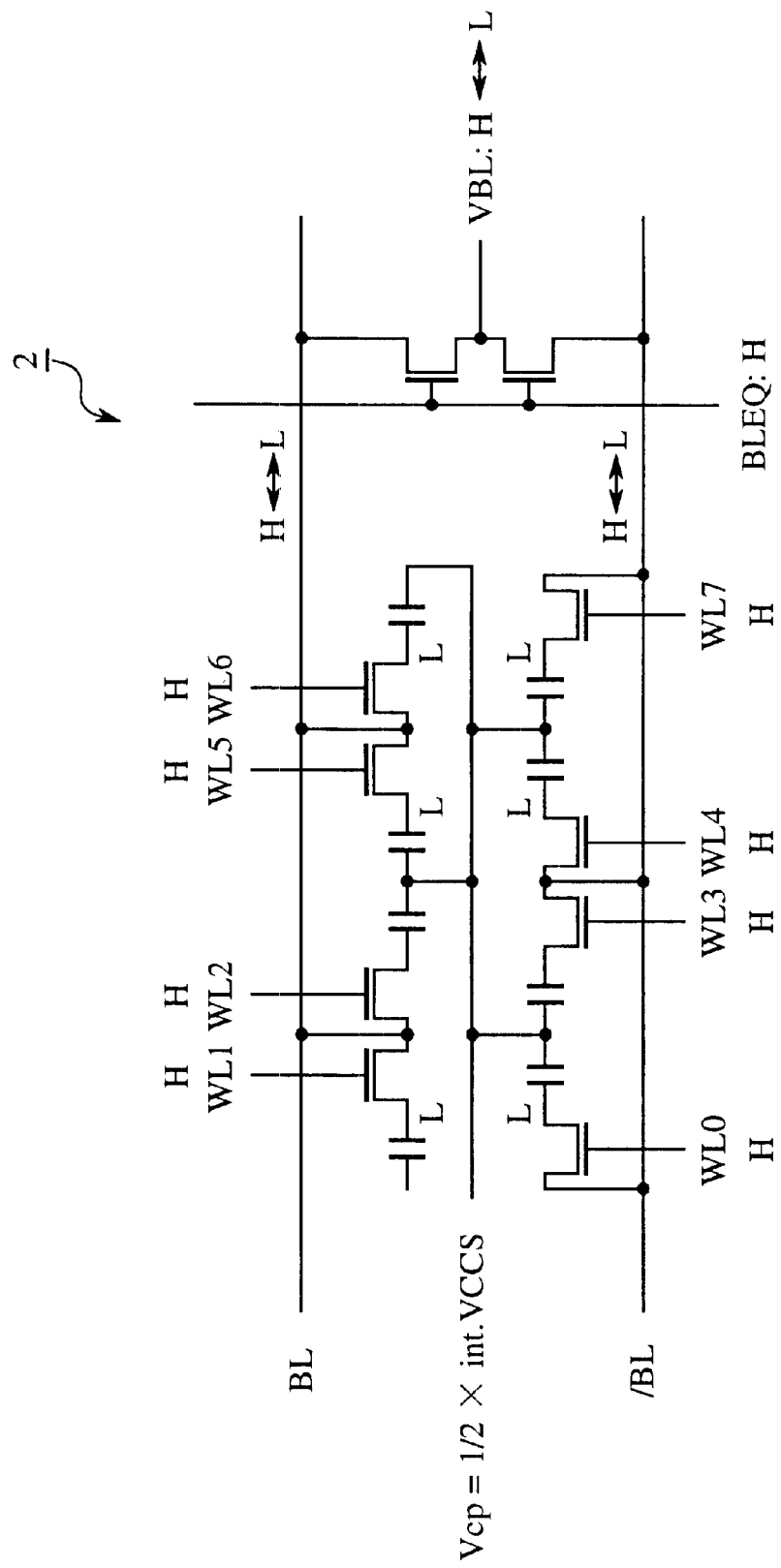
FIG. 4 is a circuit diagram showing a configuration when all the word lines in a core memory are selected simultaneously.

The invention will now be described with reference to the accompanying drawings.

EMBODIMENT 1

FIG. 1 is a block diagram showing a configuration of an embodiment 1 of an integrated semiconductor device with a wafer-level burn-in circuit in accordance with the present invention. In FIG. 1, the reference numeral 1 designates an integrated semiconductor device such as a DRAM and/or SRAM, which can also include various types of logic circuits besides the DRAM and/or SRAM. In FIG. 1, however, the logic circuits are omitted for the sake of simplicity.

The reference numeral 2 designates a memory core including a plurality of memory cells; 3 designates an access controller for controlling wafer-level burn-in operation; 4 designates a wafer-level burn-in circuit consisting of the memory core 2 and access controller 3; 5 designates a test mode register; and 6 designates a pin for inputting a control signal WBI for setting the access controller 3 in a wafer-level burn-in (WLBI) mode.

The reference numeral 7 designates pins for supplying the integrated semiconductor device 1 with an address signal A<0:11>, the values A<4> and A<5> of which are stored in the test mode register 5. For example, when the value A<4> in the address signal A<0:11> is H level, the even number word lines of memory core 2 are all selected, whereas when the value A<5> is H level, the odd number word lines are all selected. The reference numeral 8 designates a pin for inputting a control signal /MTEST (where "/" denotes a negative active signal) for setting a direct memory access (DMA) mode that enables various control signals and voltages to be directly input to or output from the integrated semiconductor device 1 through test mode pads (not shown) provided on the integrated semiconductor device 1.

The reference numeral 9 designates a pin for inputting a test mode setting signal that sets the test mode register 5 in a test mode and the integrated semiconductor device 1 in a voltage force mode which enables predetermined voltages to be forcedly applied. For example, when the H level test mode setting signal is input, the test mode register 5 is set in the test mode, and the integrated semiconductor device 1 is set in the voltage force mode. The reference numeral 10 designates output pins through which an external device such as an external tester reads data from the memory core 2 via an interface (I/F); and 11 designates an input pin for inputting an external voltage Ext.VccS for operating a sense amplifier (not shown) in the memory core 2.

The reference numeral 12 designates a pin for inputting an external voltage Ext.VccP for operating the access controller 3; 13 designates a pin for inputting an internal voltage int.VccS for operating the sense amplifier (not shown). The internal voltage int.VccS is the same as the external voltage Ext.VccS in the voltage level.

The reference numeral 14 designates a pin for inputting word line voltage VPP to be supplied to the word lines in the memory core 2; 15 designates a pin for inputting a substrate potential VBB of the integrated semiconductor device 1; 16 designates a pin for inputting a bit line voltage VBL to be supplied to bit lines of the memory core 2; and 17 designates a pin for inputting a cell plate voltage VCP.

Next, the operation of the present embodiment 1 will be described.

FIG. 2 is a flowchart illustrating the wafer-level burn-in operation in the present embodiment 1, and FIG. 3 is a table illustrating setting states determined by the control signals /MTEST and WBI in connection with the values A<4> and A<5> in the address signal A<0:11>, which are set in the test mode register 5.

When supplied with the H level control signal /MTEST and L level control signal WBI via the pins 8 and 6, respectively, the integrated semiconductor device 1 is set at a normal operation mode. In this state, the L level control signal /MTEST is supplied through the pin 8, first. This sets the integrated semiconductor device 1 in the DMA mode, in which the external tester or the like can directly supply the integrated semiconductor device 1 with the control signals, address signal and voltages through the test mode pads (not shown) and the pins 6, 7, 9–12 and 14–17.

Subsequently, the H level test mode setting signal is supplied via the pin 9. This sets the test mode register 5 in the test mode, and the integrated semiconductor device 1 in the voltage force mode, in which the voltages are supplied with their values being raised or dropped (step ST1). Incidentally, since the integrated semiconductor device 1 is not set at the voltage force mode when power is turned on, prescribed voltages generated by the internal voltage generator (not shown) are supplied to the memory core 2 or the like.

Subsequently, the address signal is supplied from the external tester (not shown) through the pins 7, and prescribed voltages are forcedly applied to the integrated semiconductor device 1 through the pins 11, 12 and 14–17, followed by supplying the H level control signal WBI via the pin 6 to set the access controller 3 in the WLBI mode. This sets the access controller 3 in the WLBI mode to perform the wafer-level burn-in (step ST2). When the WLBI mode is set, the operation of the internal voltage generator (not shown) is halted. Since the control signal /MTEST is L level in this case, the state is held in which the prescribed voltages are forcedly applied through the pins 11, 12 and 14–17.

The wafer-level burn-in is performed in the following procedure.

Figure 5:
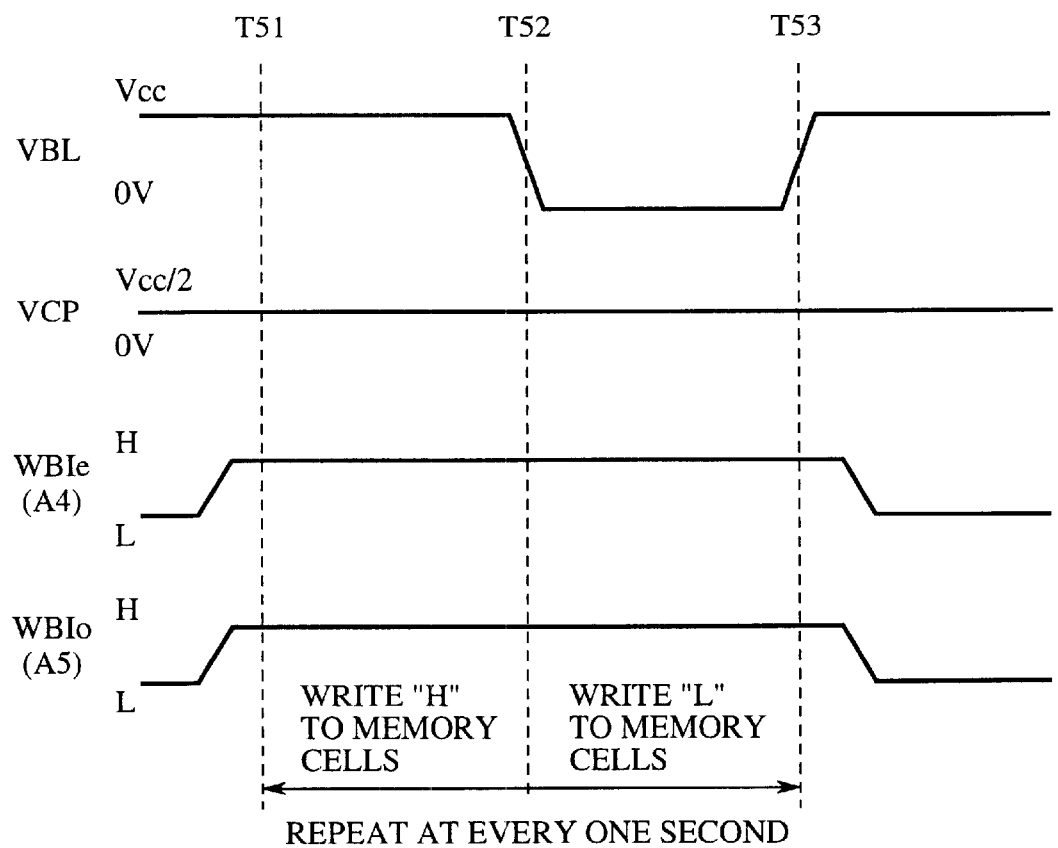
FIG. 5 is a timing chart illustrating the wafer-level burn-in operation when all the word lines are selected simultaneously as shown in FIG. 4.

FIG. 4 is a circuit diagram showing a configuration when all the word lines WL0, WL1, WL2, WL3, WL4, WL5, WL6, WL7, ... in the memory core 2 are selected simultaneously; and FIG. 5 is a timing chart illustrating the operation when all the word lines WL0, WL1, WL2, WL3, WL4, WL5, WL6, WL7, ... are selected simultaneously as shown in FIG. 4. To apply stresses by selecting all the word lines WL0, WL1, WL2, WL3, WL4, WL5, WL6, WL7, ... in the core memory 2 simultaneously and by supplying prescribed voltages, the word line voltage VPP, substrate potential VBB, bit line voltage VBL and cell plate voltage VCP of the prescribed potentials are supplied through the pins 14–17.

After that, the address signal A<0:11> is supplied with their values A<4> and A<5> set at the H level. The will set a select signal WE for selecting the even number word lines and a select signal WBIo for selecting the odd number word lines at the H level simultaneously as shown in the timing chart of FIG. 5 (timing T51). In addition, when the control voltage BLEQ to be supplied to a bit-line equalizer is set at H level as shown in FIG. 4, the sense amplifier (not shown) in the memory core 2 halts its operation, so that L level is written into the memory cells including redundant cells (not shown) in the memory core 2. In this state, the prescribed stress voltages are applied to the gate oxide film (not shown), and between the storage nodes (not shown) and cell plate (not shown). Thus, the wafer-level burn-in is carried out.

Although all the word lines undergo the wafer-level burn-in simultaneously in the example as shown in FIGS. 4 and 5, it is not essential. For example, only even number word lines or odd number word lines can be selected simultaneously to undergo the wafer-level burn-in. This will be described below.

Figure 6:
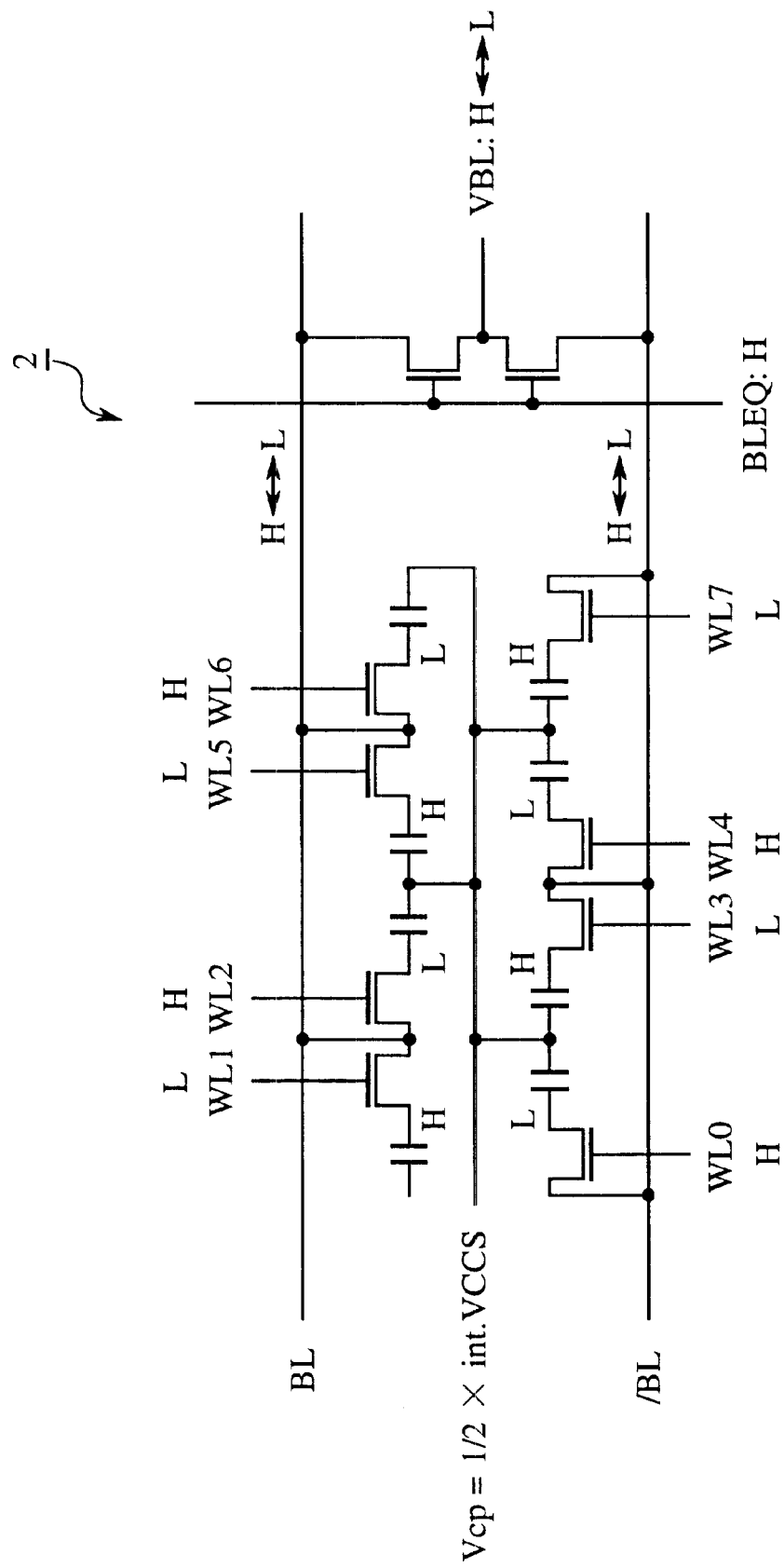
FIG. 6 is a circuit diagram showing a configuration when all the even number word lines in the memory core are selected simultaneously.
Figure 7:
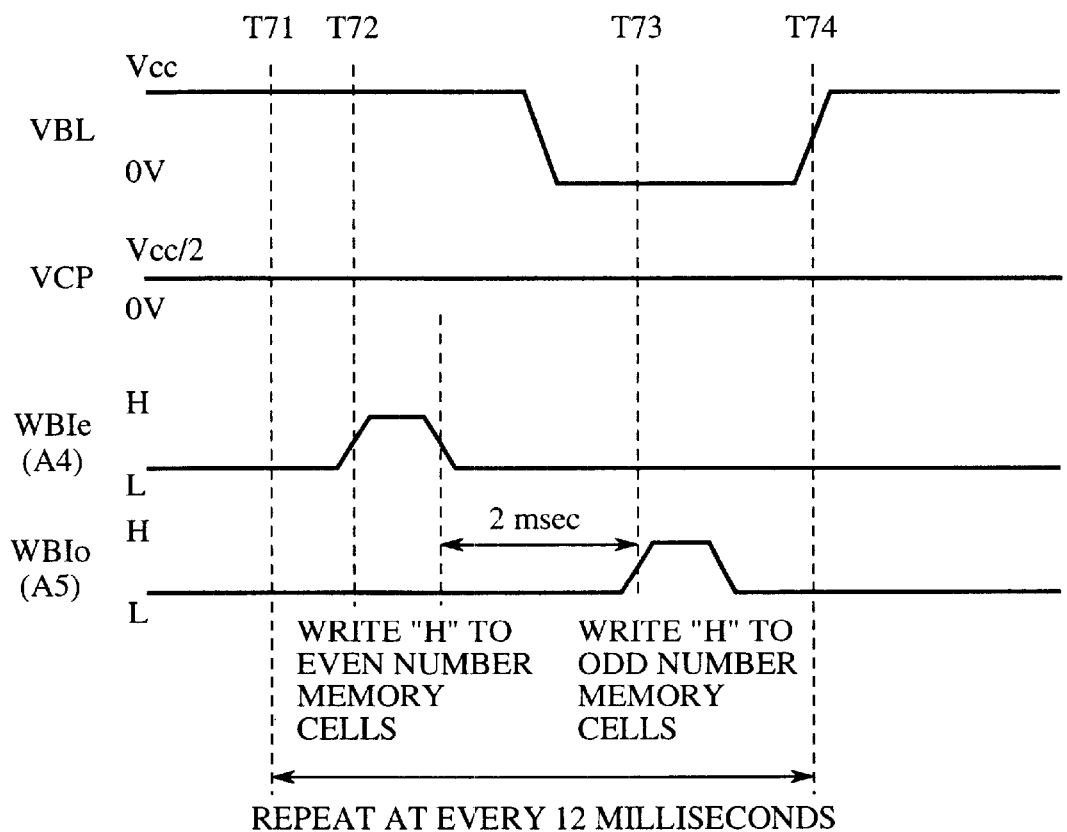
FIG. 7 is a timing chart illustrating the wafer-level burn-in operation when all the even number word lines are selected simultaneously as shown in FIG. 6 or when all the odd number word lines are selected simultaneously.

FIG. 6 is a circuit diagram showing a configuration when only the even number word lines WL0, WL2, WL4, WL6, . . . in the core memory 2 are selected simultaneously; and FIG. 7 is a timing chart illustrating the operation when only the even number word lines WL0, WL2, WL4, WL6, . . . in the core memory 2 are selected simultaneously (timing T72) as shown in FIG. 6, or when only the odd number word lines WL1, WL3, WL5, WL7, . . . in the core memory 2 are selected simultaneously (timing T73).

As in the case where all the word lines in the memory core 2 are selected simultaneously as shown in FIGS. 4 and 5, when only the even number word lines or odd number word lines are selected simultaneously, the word line voltage VPP, substrate potential VBB, bit line voltage VBL and cell plate voltage VCP of the prescribed potentials are also supplied through the pins 14–17 in order to apply stresses.

Subsequently, the address signal A<0:11> with its values A<4> and A<5> being set at H level and L level, respectively, is supplied through the pins 7, followed by the address signal A<0:11> with its values A<4> and A<5> being set at L level. When the address signal A<0:11> with its values A<4> and A<5> being set at H level and L level, respectively, is supplied as illustrated in the timing chart as shown in FIG. 7, the select signal WBIe for selecting the even number word lines is placed at H level so that the data are written in the memory cells associated with the even number word lines (timing T72).

In this case, by setting the control voltage BLEQ connected to the bit-line equalizer at H level as shown in FIG. 6, the operation of the sense amplifier (not shown) in the memory core 2 is halted, and L level data are written into the memory cells associated with the even number word lines in the memory core 2 including the redundant cells (not shown). In this state, the prescribed stress voltages are applied between the word line gates and word line gates (not shown), and between the storage nodes and storage nodes (not shown).

On the other hand, when the address signal A<0:11> with its values A<4> and A<5> being set at L level and H level, respectively, is supplied, the select signal WBIo for selecting the odd number word lines is set at H level as shown in FIG. 7 so that the data are written into memory cells associated with the odd number word lines (timing T73).

In this case, by setting the control voltage BLEQ connected to the bit-line equalizer at H level as shown in FIG. 6, the operation of the sense amplifier (not shown) in the memory core 2 is halted, and L level data are written into the memory cells associated with the odd number word lines in the memory core 2 including the redundant cells (not shown). In this state, the prescribed stress voltages are applied between the word line gates and word line gates (not shown), and between the storage nodes and storage nodes (not shown). Thus, the wafer-level burn-in is performed.

Subsequently, the L level control signal WBI is supplied through the pin 6 to release the access controller 3 from the WLBI mode. In this case, since the L level control signal /MTEST and the H level test mode setting signal continue to be supplied via the pins 8 and 9, the test mode register 5 keeps the test mode and the integrated semiconductor device 1 maintains the voltage force mode. In this condition, the external tester (not shown) supplies the address signal through the pins 7 to read test data from the memory core 2 through the pins 10 (step ST3).

The external tester (not shown) reads the data from the memory core 2 in the integrated semiconductor device 1, and compares them with the expected values that are preset in the external tester. When all the word lines are selected simultaneously, it is verified that the operation of the wafer-level burn-in circuit 4 in the WLBI mode is normal if the data read from the memory core 2 to the external tester are "L" at the BL side, and "H" at the /BL side (step ST4).

On the other hand, when the even number or odd number word lines are selected, it is verified that the operation of the wafer-level burn-in circuit 4 in the WLBI mode is normal if the data read from the memory core 2 to the external tester are identical to "L" or "H" of the individual memory cells at the BL side, and the opposite "H" or "L" at the /BL side (step ST4).

Incidentally, the voltage force mode can be released by resetting the integrated semiconductor device 1, or by supplying the test mode register 5 with the L level test mode setting signal via the pin 9. This will release the test mode register 5 from the test mode so that the integrated semiconductor device 1 is released from the voltage force mode.

As described above, the present embodiment 1 comprises the test mode register 5, and the access controller 3 in the wafer-level burn-in circuit 4; sets the integrated semiconductor device 1 in the DMA mode by placing the L level control signal /MTEST and control signal WBI in the table of the test mode register 5; sets the integrated semiconductor device 1 in the voltage force mode by placing the test mode register 5 in the test mode by supplying the test mode setting signal via the pin 9, and forcedly applies the prescribed voltages to the integrated semiconductor device 1. Furthermore, the wafer-level burn-in is performed by placing the access controller 3 in the WLBI mode by supplying the H level control signal WBI via the pin 6. After completing the wafer-level burn-in, the WLBI mode is released by supplying the L level control signal WBI to the pin 6, so that the external tester reads the test data from the memory core 2 through the pins 10 in the test mode, and compares the test data with the expected values. This makes it possible to verify that the wafer-level burn-in circuit 4 including the access controller 3 functions correctly, and hence to improve the reliability of the integrated semiconductor device 1.

EMBODIMENT 2

Figure 8:
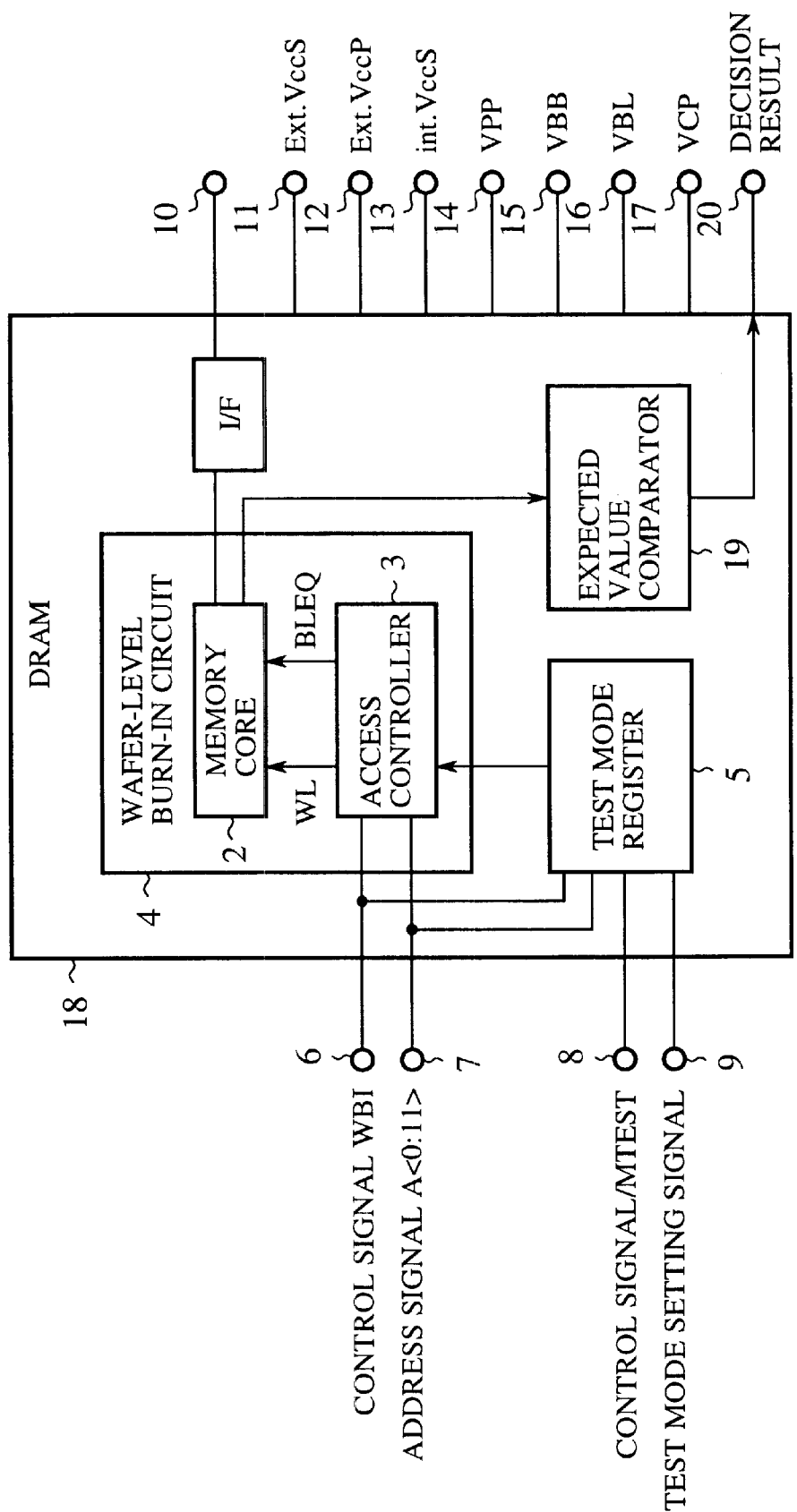
FIG. 8 is a block diagram showing a configuration of an embodiment 2 of an integrated semiconductor device with a wafer-level burn-in circuit in accordance with the present invention.

FIG. 8 is a block diagram showing a configuration of an embodiment 2 of the integrated semiconductor device with wafer-level burn-in circuit in accordance with the present invention. In FIG. 8, the reference numeral 18 designates an integrated semiconductor device. The reference numeral 19 designates an expected value comparator for comparing the data read from the memory core 2 with the expected values, and supplying the compared result to the external device (not shown) outside the integrated semiconductor device 18 through a pin 20 as the decision result of the wafer-level burn-in.

Since the remaining components are the same as those of the foregoing embodiment 1, they are designated by the same reference numerals and the description thereof is omitted here. Although the integrated semiconductor device 18 with the wafer-level burn-in circuit 4 as shown in FIG. 8 consists of a DRAM, it can be a mixture of the DRAM and/or SRAM together with various types of logic circuits. However, the logic circuits are omitted here as in the foregoing embodiment 1 for the sake of simplicity.

Next, the operation of the present embodiment 2 will be described.

Figure 9:
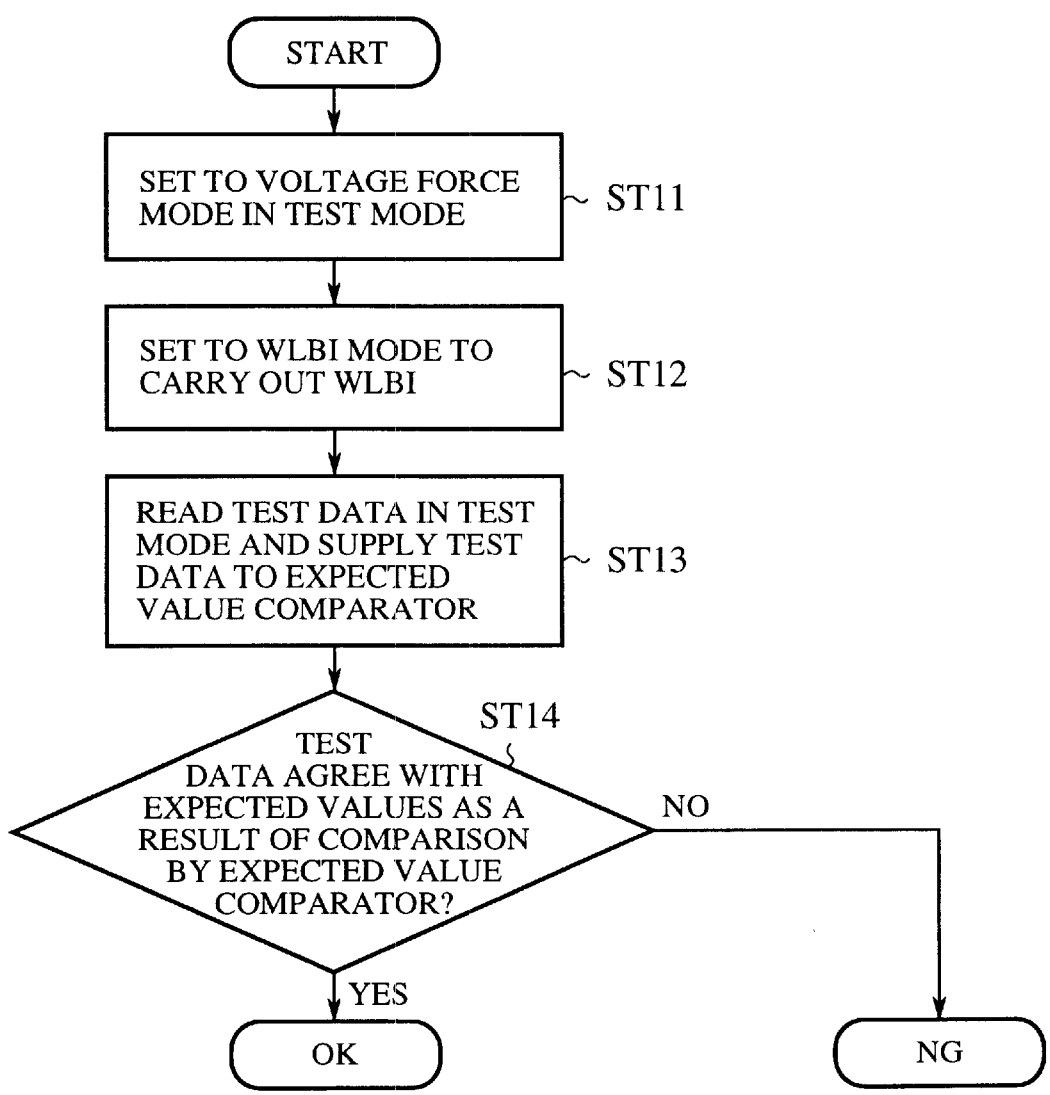
FIG. 9 is a flowchart illustrating the wafer-level burn-in operation of the embodiment 2.

FIG. 9 is a flowchart illustrating the wafer-level burn-in operation of the integrated semiconductor device 18 of the present embodiment 2 as shown in FIG. 8.

When supplied with the H level control signal /MTEST and L level control signal WBI via the pins 8 and 6, respectively, the integrated semiconductor device 1 is set at a normal operation mode. In this state, as in the foregoing embodiment 1, the L level control signal /MTEST is supplied through the pin 8, first. This sets the integrated semiconductor device 18 in the DMA mode, in which the external tester or the like can directly supply the integrated semiconductor device 18 with the control signals, address signal and voltages through the test mode pads (not shown) and the pins 6, 7, 9–12 and 14–17.

Subsequently, the H level test mode setting signal is supplied via the pin 9. This sets the test mode register 5 in the test mode, and the integrated semiconductor device 18 in the voltage force mode, in which the voltages are supplied with their values being raised or dropped (step ST11). Incidentally, since the integrated semiconductor device 18 is not set at the voltage force mode when power is turned on, the prescribed voltages generated by the internal voltage generator (not shown) are supplied to the memory core 2 or the like.

Subsequently, the address signal is supplied from the external tester (not shown) through the pins 7, and prescribed voltages are forcedly applied to the integrated semiconductor device 18 through the pins 11, 12 and 14–17, followed by supplying the H level control signal WBI via the pin 6 to set the access controller 3 in the WLBI mode. This sets the access controller 3 in the WLBI mode, and the wafer-level burn-in is performed (step ST12). When the WLBI mode is set, the operation of the internal voltage generator (not shown) is halted. Since the control signal /MTEST is L level in this case, the state is held in which the prescribed voltages are forcedly applied through the pins 11, 12 and 14–17.

The wafer-level burn-in is performed in the following procedure.

To apply stresses by selecting all the word lines WL0, WL1, WL2, WL3, WL4, WL5, WL6, WL7, . . . in the core memory 2 simultaneously and by supplying the prescribed voltages as in the foregoing embodiment 1 as shown in FIG. 4, the word line voltage VPP, substrate potential VBB, bit line voltage VBL and cell plate voltage VCP of the prescribed potentials are supplied through the pins 14–17.

After that, the address signal A<0:11> is supplied with their values A<4> and A<5> set at the H level. The will set a select signal WBIe for selecting the even number word lines and a select signal WBIo for selecting the odd number word lines at the H level simultaneously as shown in the timing chart of FIG. 5 (timing T51). In addition, when setting the control voltage BLEQ to be supplied to a bit-line equalizer at the H level as shown in FIG. 4, the sense amplifier (not shown) in the memory core 2 halts its operation, so that the L level is written into the memory cells including redundant cells (not shown) in the memory core 2. In this state, the prescribed stress voltages are applied to the gate oxide film (not shown), and between the storage node (not shown) and cell plate (not shown). Thus, the wafer-level burn-in is carried out.

Although all the word lines undergo the wafer-level burn-in simultaneously in the example as shown in FIGS. 4 and 5, it is not essential. For example, only even number word lines or odd number word lines can be selected simultaneously to undergo the wafer-level burn-in as in the foregoing embodiment 1. This will be described below.

FIG. 6 is a circuit diagram showing a configuration when only the even number word lines WL0, WL2, WL4, WL6, . . . in the core memory 2 are selected simultaneously; and FIG. 7 is a timing chart illustrating the operation when only the even number word lines WL0, WL2, WL4, WL6, . . . in the core memory 2 are selected simultaneously (timing T72) as shown in FIG. 6, or when only the odd number word lines WL1, WL3, WL5, WL7, . . . in the core memory 2 are selected simultaneously (timing T73).

As in the case where all the word lines in the memory core 2 are selected simultaneously as shown in FIGS. 4 and 5, when only the even number word lines or odd number word lines are selected simultaneously, the word line voltage VPP, substrate potential VBB, bit line voltage VBL and cell plate voltage VCP of the prescribed potentials are supplied through the pins 14–17 in order to apply stresses.

Subsequently, the address signal A<0:11> with its values A<4> and A<5> being set at H level and L level, respectively, is supplied through the pins 7, followed by the address signal A<0:11> with its values A<4> and A<5> being set at L level. When the address signal A<0:11> with its values A<4> and A<5> being set at H level and L level, respectively, is supplied as illustrated in the timing chart of FIG. 7, the select signal WBIe for selecting the even number word lines is placed at H level so that the data are written in the memory cells associated with the even number word lines (timing T72).

In this case, by setting the control voltage BLEQ connected to the bit-line equalizer at H level as shown in FIG. 6, the operation of the sense amplifier (not shown) in the memory core 2 is halted, and L level data are written into the memory cells associated with the even number word lines in the memory core 2 including the redundant cells (not shown). In this state, the prescribed stress voltages are applied between the word line gates and word line gates (not shown), and between the storage nodes and storage nodes (not shown).

On the other hand, when the address signal A<0:11> with its values A<4> and A<5> being set at L level and H level, respectively, is supplied, the select signal WBIo for selecting the odd number word lines is set at H level so that the data are written into memory cells associated with the odd number word lines (timing T73).

In this case, by setting the control voltage BLEQ connected to the bit-line equalizer at H level as shown in FIG. 6, the operation of the sense amplifier (not shown) in the memory core 2 is halted, and L level data are written into the memory cells associated with the odd number word lines in the memory core 2 including the redundant cells (not shown). In this state, the prescribed stress voltages are applied between the word line gates and word line gates (not shown), and between the storage nodes and storage nodes (not shown). Thus, the wafer-level burn-in is performed.

Subsequently, the L level control signal WBI is supplied through the pin 6 to release the access controller 3 from the WLBI mode. In this case, since the L level control signal /MTEST and the H level test mode setting signal continue to be supplied via the pins 8 and 9, the test mode register 5 keeps the test mode and the integrated semiconductor device 1 maintains the voltage force mode. In this condition, the expected value comparator 19 reads the test data from the memory core 2 (step ST13).

Subsequently, the expected value comparator 19 compares the data read from the memory core 2 with the preset expected values. When all the word lines are selected simultaneously, it is verified that the operation of the wafer-level burn-in circuit 4 in the WLBI mode is normal if the data read from the memory core 2 to the expected value comparator 19 are "L" at the BL side, and "H" at the /BL side (step ST14).

On the other hand, when the even number or odd number word lines are selected, it is verified that the operation of the wafer-level burn-in circuit 4 in the WLBI mode is normal if the data read from the memory core 2 to the expected value comparator 19 are identical to "L" or "H" of the individual memory cells at the BL side, and the opposite "H" or "L" at the /BL side, and the decision result is output to the external tester (not shown) through the pin 20 (step ST14).

Incidentally, the voltage force mode can be released by resetting the integrated semiconductor device 1, or by supplying the test mode register 5 with the L level test mode setting signal via the pin 9 as in the foregoing embodiment 1. This will release the test mode register 5 from the test mode so that the integrated semiconductor device 1 is released from the voltage force mode.

As described above, the present embodiment 2 comprises, besides the components of the foregoing embodiment 1, the expected value comparator 19 in the integrated semiconductor device 18, wherein the expected value comparator 19 reads the test data from the memory core 2 after completing the wafer-level burn-in, compares the test data with the expected values, makes a decision as to whether the wafer-level burn-in circuit 4 functions correctly, and outputs the decision result through the pin 20. This offers, in addition to the advantage of the foregoing embodiment 1, an advantage of being able to simplify the configuration of the external tester, thereby reducing the cost of the wafer-level burn-in.

What is claimed is:

1. An integrated semiconductor device with a wafer-level burn-in circuit comprising:

a memory core including a plurality of memory cells;

an access controller for controlling wafer-level burn-in operation by controlling input and output of control signals, an address signal and test data used by the wafer-level burn-in operation; and a test mode register for setting operation conditions of the wafer-level burn-in operation, wherein said integrated semiconductor device is set, when said test mode register is set in a test mode, in a DMA (direct memory access) mode that enables the address signal, the test data and prescribed voltages to be directly input from and output to outside, and is forcedly supplied with the prescribed voltages required for the wafer-level burn-in operation, wherein said access controller, being set in a wafer-level burn-in mode, supplies said memory core with the address signal and test data in accordance with a wafer-level burn-in operation condition which is set in said test mode register, and performs the wafer-level burn-in operation, and wherein said integrated semiconductor device reads, when said access controller is released from the wafer-level burn-in mode, the test data in said memory core in the DMA mode, and outputs the test data to the outside.

2. The integrated semiconductor device with wafer-level burn-in circuit according to claim 1, further comprising an expected value comparator for reading the test data in the memory core after the wafer-level burn-in operation is completed and the access controller is released from the wafer-level burn-in mode, for comparing the test data read from the memory core with preset expected values, and for outputting a compared result, wherein said integrated semiconductor device outputs the compared result obtained by said expected value comparator.

3. The integrated semiconductor device with wafer-level burn-in circuit according to claim 2, wherein said access controller performs the wafer-level burn-in operation by supplying said memory core with one of the address signal for selecting all word lines in said core memory simultaneously, the address signal for selecting only even number word lines simultaneously, and the address signal for selecting only odd number word lines simultaneously.

4. The integrated semiconductor device with wafer-level burn-in circuit according to claim 1, wherein said access controller performs the wafer-level burn-in operation by supplying said memory core with one of the address signal for selecting all word lines in said core memory simultaneously, the address signal for selecting only even number word lines simultaneously, and the address signal for selecting only odd number word lines simultaneously.

5. A function decision method of a wafer-level burn-in circuit comprising the steps of:

setting in a test mode a test mode register in which a wafer-level burn-in operation condition is set;

setting an integrated semiconductor device with the wafer-level burn-in circuit in a DMA (direct memory access) mode that enables an address signal, test data and prescribed voltages to be directly input from and output to outside;

forcedly applying the prescribed voltages required for the wafer-level burn-in operation to the integrated semiconductor device;

performing the wafer-level burn-in operation, when an access controller in the wafer-level burn-in circuit is set in a wafer-level burn-in mode and supplies a memory core with the address signal and test data in accordance with the wafer-level burn-in operation condition set in the test mode register;

releasing said access controller from the wafer-level burn-in mode after completing the wafer-level burn-in operation;

reading the test data in said memory core in the DMA mode; and outputting the test data read from said memory core to the outside to be compared with expected values.

6. The function decision method of the wafer-level burn-in circuit according to claim 5, further comprising the steps of:

reading the test data from the memory core after releasing said access controller from the wafer-level burn-in mode;

comparing the test data read from the memory core with preset expected values; and outputting a compared result as a function decision result of said wafer-level burn-in circuit.

* * * * *